United States Patent
Wakabayashi et al.

(10) Patent No.: US 10,460,983 B2
(45) Date of Patent: *Oct. 29, 2019

(54) METHOD FOR MANUFACTURING A BONDED SOI WAFER

(71) Applicant: SHIN-ETSU HANDOTAI CO., LTD., Tokyo (JP)

(72) Inventors: Taishi Wakabayashi, Nagano (JP); Kenji Meguro, Nagano (JP); Masatake Nakano, Annaka (JP); Shinichiro Yagi, Takasaki (JP); Tomosuke Yoshida, Annaka (JP)

(73) Assignee: SHIN-ETSU HANDOTAI CO.,LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/304,452

(22) PCT Filed: Mar. 4, 2015

(86) PCT No.: PCT/JP2015/001141
§ 371 (c)(1),
(2) Date: Oct. 14, 2016

(87) PCT Pub. No.: WO2015/162839
PCT Pub. Date: Oct. 29, 2015

(65) Prior Publication Data
US 2017/0040210 A1    Feb. 9, 2017

(30) Foreign Application Priority Data

Apr. 24, 2014 (JP) ................. 2014-090012

(51) Int. Cl.
*H01L 21/762* (2006.01)
*H01L 27/12* (2006.01)
(Continued)

(52) U.S. Cl.
CPC .... *H01L 21/76256* (2013.01); *H01L 21/0262* (2013.01); *H01L 21/02164* (2013.01);
(Continued)

(58) Field of Classification Search
CPC .............. H01L 27/12; H01L 21/30625; H01L 21/0262; H01L 21/02595; H01L 21/02532;
(Continued)

(56) References Cited

U.S. PATENT DOCUMENTS 4,631,804 A * 12/1986 Roy .................... H01L 21/3221
148/DIG. 122
4,742,020 A    5/1988 Roy
(Continued)

FOREIGN PATENT DOCUMENTS

CN    102640278 A    8/2012
CN    103460371 A    12/2013
(Continued)

OTHER PUBLICATIONS

Jun. 2, 2015 Search Report issued in International Patent Application No. PCT/JP2015/001141.
(Continued)

*Primary Examiner* — Savitri Mulpuri
(74) *Attorney, Agent, or Firm* — Oliff PLC

(57) ABSTRACT

A method for manufacturing a bonded SOI wafer by bonding a bond wafer and a base wafer, each composed of a silicon single crystal, via an insulator film, including the steps of: depositing a polycrystalline silicon layer on the bonding surface side of the base wafer, polishing a surface of the polycrystalline silicon layer, forming the insulator film on the bonding surface of the bond wafer, bonding the polished surface of the polycrystalline silicon layer of the base wafer and the bond wafer via the insulator film, and
(Continued)

thinning the bonded bond wafer to form an SOI layer; As a result, it is possible to provide a method for manufacturing a bonded SOI wafer which can prevent single-crystallization of polycrystalline silicon while suppressing an increase of the warpage of a base wafer even when the polycrystalline silicon layer to function as a carrier trap layer is deposited sufficiently thick.

1 Claim, 2 Drawing Sheets

(51) Int. Cl.
  H01L 21/02       (2006.01)
  H01L 21/306      (2006.01)
  H01L 21/3205     (2006.01)
(52) U.S. Cl.
  CPC .. *H01L 21/02307* (2013.01); *H01L 21/02381* (2013.01); *H01L 21/02428* (2013.01); *H01L 21/02488* (2013.01); *H01L 21/02532* (2013.01); *H01L 21/02595* (2013.01); *H01L 21/30625* (2013.01); *H01L 21/76254* (2013.01); *H01L 27/12* (2013.01); *H01L 21/02052* (2013.01); *H01L 21/02238* (2013.01); *H01L 21/32055* (2013.01)
(58) Field of Classification Search
  CPC ......... H01L 21/76256; H01L 21/02428; H01L 21/02381; H01L 21/02307; H01L 21/02164; H01L 21/02488; H01L 21/76254; H01L 21/32055; H01L 21/02238; H01L 21/02052
  See application file for complete search history.

(56) References Cited

U.S. PATENT DOCUMENTS

| | | | |
|---|---|---|---|
| 4,897,360 A | 1/1990 | Guckel et al. | |
| 5,138,421 A | 8/1992 | Saito | |
| 5,863,659 A * | 1/1999 | Kobayashi | H01L 21/304 257/627 |
| 6,091,112 A * | 7/2000 | Kwon | H01L 21/76251 257/347 |
| 6,174,740 B1 * | 1/2001 | Ohta | G01N 33/20 438/14 |
| 6,479,166 B1 | 11/2002 | Heuer et al. | |
| 6,902,977 B1 * | 6/2005 | Kluth | H01L 21/28035 257/E21.197 |
| 6,991,999 B2 * | 1/2006 | Fu | H01L 21/28035 257/E21.197 |
| 7,809,039 B2 * | 10/2010 | Yamamoto | B82Y 20/00 372/43.01 |
| 8,895,435 B2 * | 11/2014 | Lin | H01L 21/28035 257/754 |
| 8,962,450 B2 | 2/2015 | Reynaud et al. | |
| 9,000,679 B2 * | 4/2015 | Tsuda | H05B 33/0815 315/291 |
| 9,018,031 B2 * | 4/2015 | Tsukamoto | H01L 27/14632 438/459 |
| 9,337,395 B2 * | 5/2016 | Kalem | H01L 29/7831 |
| 9,356,171 B2 * | 5/2016 | Liu | H01L 31/0368 |
| 2002/0045329 A1 * | 4/2002 | Oi | H01L 21/2007 438/524 |
| 2002/0068420 A1 * | 6/2002 | Goodwin | H01L 21/32055 438/459 |
| 2003/0025198 A1 | 2/2003 | Chrysler et al. | |
| 2003/0047734 A1 * | 3/2003 | Fu | H01L 21/28035 257/64 |
| 2004/0266055 A1 * | 12/2004 | Ravi | C23C 16/272 438/105 |
| 2006/0166451 A1 | 7/2006 | Raskin et al. | |
| 2007/0032040 A1 | 2/2007 | Lederer | |
| 2009/0104752 A1 * | 4/2009 | Yoshida | H01L 21/76256 438/459 |
| 2011/0186840 A1 * | 8/2011 | Jerome | H01L 21/02381 257/49 |
| 2012/0319121 A1 | 12/2012 | Reynaud et al. | |
| 2013/0009193 A1 * | 1/2013 | Ohtsu | C23C 14/3435 257/99 |
| 2014/0038388 A1 | 2/2014 | Reynaud et al. | |
| 2014/0084290 A1 | 3/2014 | Allibert et al. | |

FOREIGN PATENT DOCUMENTS

| | | |
|---|---|---|
| JP | H03-132055 A | 6/1991 |
| JP | H05-226464 A | 9/1993 |
| JP | H10-189404 A | 7/1998 |
| JP | 2000-183153 A | 6/2000 |
| JP | 2007-507093 A | 3/2007 |
| JP | 2007-507100 A | 3/2007 |
| JP | 2010-278160 A | 12/2010 |
| JP | 2012-164906 A | 8/2012 |
| JP | 2013-513234 A | 4/2013 |
| JP | 2015-050429 A | 3/2015 |

OTHER PUBLICATIONS

Oct. 30, 2017 Office Action and Search Report cited in Singaporean Patent Application No. 11201608562R.
Nov. 10, 2017 Extended European Search Report issued in European Patent Application No. 15783058.9.
Jun. 5, 2018 Office Action issued in Chinese Application No. 201580020540.9.
Jun. 4, 2018 Office Action issued in Chinese Application No. 201580020538.1.
Aug. 16, 2018 Office Action issued in Singapore Application No. 11201608563S.
Oct. 4, 2018 Office Action issued in U.S. Appl. No. 15/303,596.
Jun. 2, 2015 International Search Report issued in Patent Application No. PCT/JP2015/001195.
Oct. 30, 2017 Office Action issued in Singaporean Patent Application No. 11201608563S.
Nov. 10, 2017 Extended European Search Report issued in European Patent Application No. 15782293.3.
Dec. 31, 2018 Office Action issued in U.S. Appl. No. 15/303,596.

* cited by examiner

METHOD FOR MANUFACTURING A BONDED SOI WAFER

BACKGROUND OF THE INVENTION

1. Field of the Invention

The present invention relates to a method for manufacturing a bonded SOI wafer.

2. Description of the Related Art

As an SOI wafer for a RF (Radio Frequency) device, the SOI wafer has been treated by increasing the resistivity of the base wafer. However, it has been required to cope with higher frequency in order to handle further speedup, and accordingly it comes to be difficult to handle only by using conventional high-resistance wafers.

As a countermeasure, it has been proposed to add a layer which is effective in annihilating generated carriers (a carrier trap layer) immediately under a buried oxide film layer (a BOX layer) of an SOI wafer. Accordingly, it is becoming necessary to form a high-resistance polycrystalline silicon layer on a base wafer to recombine carriers generated in a high-resistance wafer.

Patent Literature 1 describes forming a polycrystalline silicon layer or an amorphous silicon layer as a carrier trap layer on the interface of a BOX layer and a base wafer.

On the other hand, Patent Literature 2 also describes forming a polycrystalline layer as a carrier trap layer on the interface of a BOX layer and a base wafer, and limits the temperature of a heat treatment after forming the polycrystalline silicon layer in order to prevent re-crystallization of the polycrystalline silicon layer.

Patent Literature 3 describes that a surface roughness on the surface side to be bonded with a bond wafer of a base wafer is enlarged to obtain a similar effect to a carrier trap layer, although it does not describes formation of a polycrystalline silicon layer or an amorphous silicon layer as a carrier trap layer.

CITATION LIST

Patent Literature

Patent Literature 1: Japanese Unexamined Patent Publication (Kohyou) No. 2007-507093
Patent Literature 2: Japanese Unexamined Patent Publication (Kohyou) No. 2013-513234
Patent Literature 3: Japanese Unexamined Patent Publication (Kokai) No. 2010-278160

SUMMARY OF THE INVENTION

As described above, in order to produce a device to cope with higher frequency, it is becoming necessary to form a carrier trap layer under a BOX layer of an SOI wafer.

Furthermore, the thickness of a polycrystalline silicon layer to function as a carrier trap layer is relatively thick, such as 0.5 μm or more, and is suitable to be grown only on the one side as rapidly as possible. The present inventors have investigated to find that, however, when a polycrystalline silicon layer is deposited thickly only on the one side, the warpage of a wafer becomes larger as the thickness increases, thereby causing a bond failure.

On the other hand, in order to deposit a polycrystalline silicon layer as rapidly as possible, the growth temperature have to be higher. However, it is found that when the growth temperature becomes higher, there arises a problem that a part of a native oxide film on the surface of a base wafer disappears and at the above portion a polycrystalline silicon layer does not grow and single crystallizes.

The present invention was accomplished in view of the above-described problems, and it is an object of the present invention to provide a method for manufacturing a bonded SOI wafer which can prevent single-crystallization of polycrystalline silicon while suppressing an increase of the warpage of a base wafer even when the polycrystalline silicon layer to function as a carrier trap layer is deposited sufficiently thick.

To achieve the object described above, the present invention provides a method for manufacturing a bonded SOI wafer by bonding a bond wafer and a base wafer, each composed of a silicon single crystal, via an insulator film, comprising the steps of:

depositing a polycrystalline silicon layer on the bonding surface side of the base wafer, polishing a surface of the polycrystalline silicon layer, forming the insulator film on the bonding surface of the bond wafer, bonding the polished surface of the polycrystalline silicon layer of the base wafer and the bond wafer via the insulator film, and thinning the bonded bond wafer to form an SOI layer; wherein, as the base wafer, a silicon single crystal wafer having a resistivity of 100 Ω·cm or more is used, the step for depositing the polycrystalline silicon layer further comprises a stage for previously forming an oxide film on the surface of the base wafer on which the polycrystalline silicon layer is deposited, and the polycrystalline silicon layer is deposited by two stages comprising a first growth performed at a first temperature of 1010° C. or less and a second growth performed at a second temperature being higher than the first temperature to deposit the polycrystalline silicon layer thicker than in the first growth.

By previously forming an oxide film on the surface of a silicon single crystal of a base wafer and setting the deposition temperature of a polycrystalline silicon layer to 1010° C. or less, elimination of a part of the oxide film on the surface of the base wafer can be prevented, single-crystallization of the polycrystalline silicon layer can be prevented thereby, and accordingly an effect as a carrier trap layer can be sustained.

Moreover, by depositing a polycrystalline silicon layer at a low temperature of 1010° C. or less and then depositing a thicker polycrystalline silicon layer at a higher temperature than that, the warpage of the wafer can be suppressed while depositing the polycrystalline silicon layer to a sufficient thickness rapidly and efficiently.

The oxide film is preferably formed by wet cleaning.

The interposition of an oxide film between a base wafer and a polycrystalline silicon layer can influence the property of an RF device. Accordingly, it is preferable to form the oxide film with the thickness being thinner, for example, a thickness of 10 nm or less is preferable. The method for forming an oxide film with such a thickness includes wet cleaning as the most convenient method.

In this case, it is preferable to set the first temperature to 900° C. or more, and the second temperature to 1100° C. or more.

By setting the first temperature to 900° C. or more, it is possible to prevent lowering of productivity, which is caused by getting the deposition rate too low.

By setting the second temperature to 1100° C. or more, it is possible to obtain sufficiently high deposition rate to improve the productivity, and it is possible to sufficiently suppress the warpage of the wafer after depositing the polycrystalline silicon layer.

Further, even when the temperature of a heat treatment step of a step for manufacturing an SOI wafer or a heat treatment of a step for manufacturing a device is relatively high (e.g., about 1000 to 1200° C.), since the polycrystalline silicon layer is deposited at the equivalent temperature thereto, it is also possible to sufficiently suppress grain growth of the polycrystalline silicon layer and to sustain an effect as a carrier trap layer thereby.

In this case, the polycrystalline silicon layer preferably has a thickness of 2 μm or more when the base wafer and the bond wafer are bonded.

By setting the thickness of the polycrystalline silicon layer to 2 μm or more when the base wafer and the bond wafer are bonded, the frequency of a bond failure increases due to an influence of the warpage of a wafer. However, when the second growth has been performed at a higher temperature than in the first growth in depositing the polycrystalline silicon layer, the warpage of a wafer can be suppressed, and accordingly the bond failure can be lowered while enhancing the effect as a carrier trap layer, even when the thickness of the polycrystalline silicon layer is 2 μm or more when the base wafer and the bond wafer are bonded.

As described above, according to the present invention, by previously forming an oxide film on the surface of a silicon single crystal of a base wafer and setting the deposition temperature of a polycrystalline silicon layer to 1010° C. or less, it is possible to prevent disappearance of a part of the oxide film on the surface of the base wafer, to prevent single-crystallization of the polycrystalline silicon layer thereby, and accordingly to sustain an effect as a carrier trap layer.

Furthermore, by depositing a polycrystalline silicon layer at a low temperature of 1010° C. or less and then depositing a thicker polycrystalline silicon layer at a higher temperature than that, it is possible to suppress the warpage of the wafer while depositing the polycrystalline silicon layer to a sufficient thickness rapidly and efficiently.

DETAILED DESCRIPTION OF THE PREFERRED EMBODIMENTS

Hereinafter, the present invention will be explained in detail as an example of the embodiment with reference to the drawings, but the present invention is not restricted thereto.

As described above, it comes to be necessary to form a carrier trap layer under a BOX layer of an SOI wafer in order to manufacture a device which can cope with higher frequency. The polycrystalline silicon layer is required to have a relatively thick film thickness in order to function as a carrier trap layer, and is suitable to be grown only on the one side as rapidly as possible. However, when a polycrystalline silicon layer is deposited thickly only on the one side, there arises a problem that the warpage of a wafer becomes larger as the thickness increases, thereby causing a bond failure. Moreover, in order to deposit a polycrystalline silicon layer as rapidly as possible, the growth temperature is required to be higher. However, when the growth temperature becomes higher, there arises a problem that a part of a native oxide film on the surface of a base wafer disappears and at the above portion a polycrystalline silicon layer does not grow and single crystallizes.

Accordingly, the present inventors have diligently investigated on the method for manufacturing a bonded SOI wafer which can prevent single-crystallization of polycrystalline silicon while suppressing an increase of the warpage of a base wafer even when the polycrystalline silicon layer to function as a carrier trap layer is deposited with sufficiently thick thickness.

As a result, the present inventors have found that by previously forming an oxide film on the surface of a silicon single crystal of a base wafer and setting the subsequent deposition temperature of a polycrystalline silicon layer to 1010° C. or less, it is possible to prevent disappearance of a part of the oxide film on the surface of the base wafer, to prevent single-crystallization of the polycrystalline silicon layer thereby, and accordingly to sustain an effect as a carrier trap layer; and furthermore, by depositing a polycrystalline silicon layer at a low temperature of 1010° C. or less and then depositing the thicker polycrystalline silicon layer at a higher temperature than that, the warpage of a wafer can be suppressed while depositing the polycrystalline silicon layer to a sufficient thickness rapidly and efficiently; thereby bringing the present invention to completion.

Hereinafter, an example of an embodiment of the method for manufacturing a bonded SOI wafer of the present invention will be explained with reference to FIGS. 1 to 2.

Figure 1:
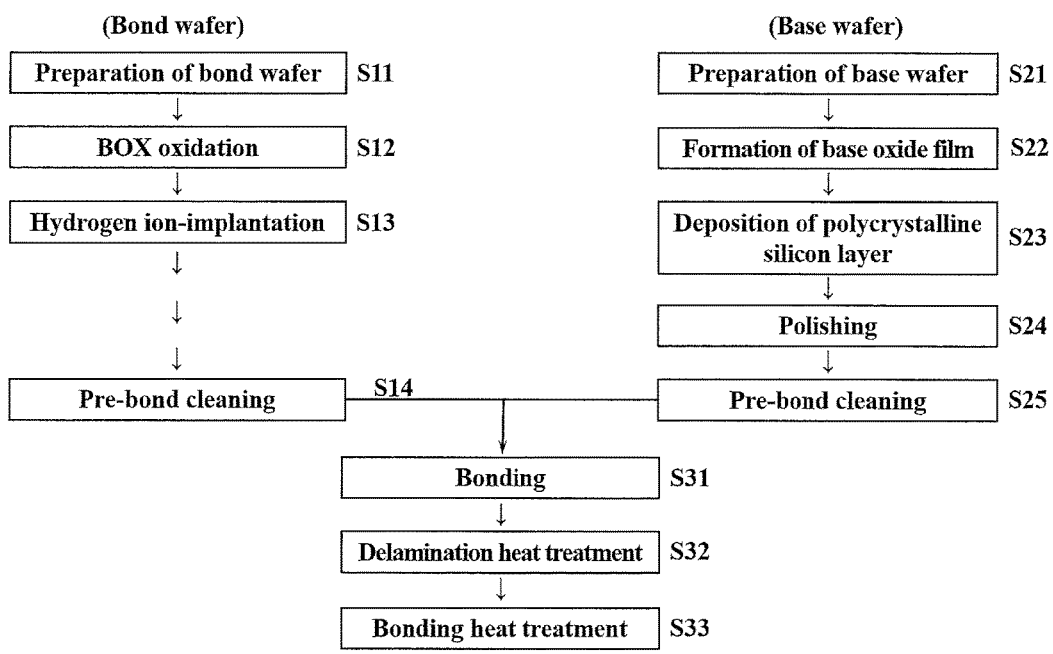
FIG. 1 is a production flow exemplifying an example of an embodiment of the method for manufacturing a bonded SOI wafer of the present invention.
Figure 2:
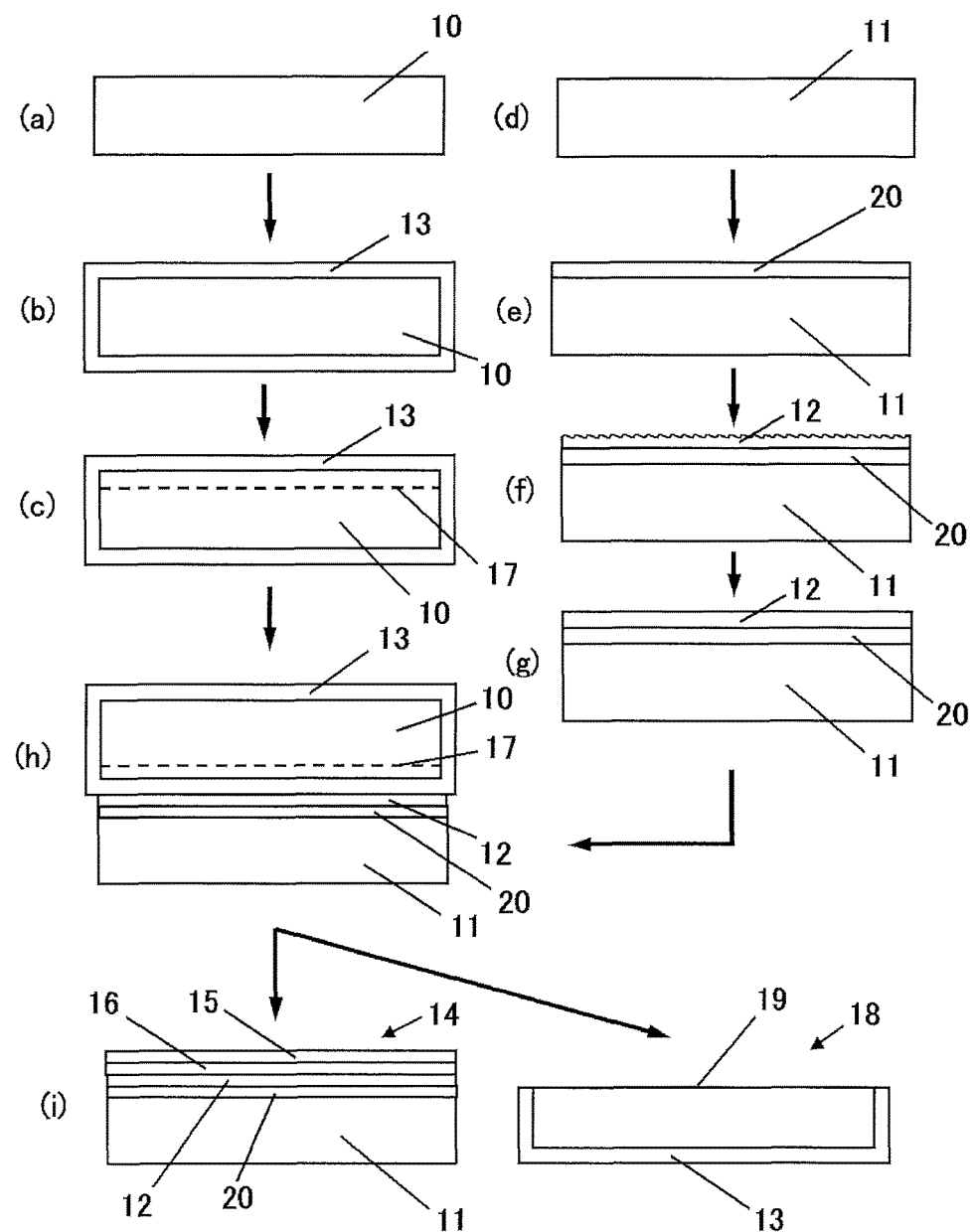
FIG. 2 is a sectional process view exemplifying an example of an embodiment of the method for manufacturing a bonded SOI wafer of the present invention.

First, a bond wafer 10 composed of a silicon single crystal is prepared (see Step S11 in FIG. 1 and FIG. 2(*a*)).

Then, on the bond wafer 10, an insulator film (e.g., an oxide film) 13, which forms a buried oxide film layer (a BOX layer) 16, is grown by thermal oxidation or CVD or the like, for example (see Step S12 in FIG. 1 and FIG. 2(*b*)).

Subsequently, from upper side of the insulator film 13, at least one gas ion selected from a hydrogen ion and a rare gas ion is implanted to form an ion-implanted layer 17 in the bond wafer 10 with an ion-implantation apparatus (see Step S13 in FIG. 1 and FIG. 2(*c*)). In this case, an accelerating voltage of the ion-implantation can be selected such that a targeted thickness of an SOI layer 15 can be obtained.

Then, in order to remove particles on the bonding surface of the bond wafer 10, pre-bond cleaning is performed (see Step S14 in FIG. 1).

On the other hand, a base wafer 11 composed of a silicon single crystal is prepared in addition to the bond wafer (see Step S21 in FIG. 1 and FIG. 2 (*d*)).

Then, on the base wafer 11, an oxide film (a base oxide film) 20 is formed (see Step S22 in FIG. 1 and FIG. 2(*e*)). The thickness of the oxide film 20 is not particularly limited. However, the thickness of the oxide film to be formed is preferably thinner, for example, the thickness of 0.3 nm or more and 10 nm or less is preferable, since the interposed oxide film 20 between the base wafer 11 and the polycrystalline silicon layer 12 can influence property of an RF device.

The method to form an oxide film with such a thickness includes wet cleaning as the most convenient method. Specifically, a uniform oxide film with a thickness of approximately 0.5 to 3 nm can be formed by cleaning with SC1 (a mixed aqueous solution of $NH_4OH$ and $H_2O_2$), SC2 (a mixed aqueous solution of HCl and $H_2O_2$), sulfuric acidhydrogen peroxide water mixture (a mixed aqueous mixed solution of $H_2SO_4$ and $H_2O_2$), ozone water, etc., or a mixture thereof.

Subsequently, on the oxide film (the base oxide film) 20, a polycrystalline silicon layer 12 is deposited (see Step S23 in FIG. 1 and FIG. 2(f)). Here, the deposition of the polycrystalline silicon layer 12 is performed, being divided into two stages comprising a first growth performed at a first temperature of 1010° C. or less and a second growth (which is carried out after the first growth) performed at a second temperature being higher than the first temperature to deposit the polycrystalline silicon layer thicker than in the first growth.

By previously forming an oxide film between the surface of a silicon single crystal of a base wafer and the polycrystalline silicon layer to be deposited, and by setting the deposition temperature in the subsequent first growth to 1010° C. or less, it is possible to prevent disappearance of a part of the oxide film on the surface of the base wafer. Moreover, by depositing the polycrystalline silicon layer with a prescribed film thickness (approximately 0.5 μm) at a low temperature of 1010° C. or less, and then in the second growth, by depositing more thickly than in the first growth and at a higher temperature than in the first growth, the warpage of the wafer can be suppressed while depositing the polycrystalline silicon layer 12 to a sufficient thickness rapidly and efficiently.

It is to be noted that these two-stage growth can be performed continuously, and can also be performed in such a way that the second growth is performed after temporarily taking out the wafer from a growing furnace.

Then, the surface of the polycrystalline silicon layer 12 deposited on the base wafer 11 is flattened by polishing (see Step S24 in FIG. 1 and FIG. 2(g)). The polycrystalline silicon layer 12 deposited at a high temperature has a large surface roughness, and is difficult to bond as it is. Accordingly, it is necessary to flatten the surface of the polycrystalline silicon layer 12 by polishing.

Subsequently, pre-bond cleaning is performed in order to remove particles on the surface of the polished polycrystalline silicon layer 12 (see Step S25 in FIG. 1).

It is to be noted that Steps S11 to S14 in FIG. 1 and Steps S21 to S25 in FIG. 1 can be conducted in parallel.

Then, the base wafer 11 on which the polycrystalline silicon layer 12 has been formed and the bond wafer 10 on which the insulator film 13 has been formed are adhered to be bonded in such a way that the implanted surface of the bond wafer 10 is in contact with the side of the base wafer 11 on which the polycrystalline silicon layer 12 has been formed (see Step S31 in FIG. 1 and FIG. 2(h)).

Subsequently, the bonded wafer is subjected to a heat treatment to generate a micro bubble layer in the ion-implanted layer 17 (a delamination heat treatment), and is delaminated along the generated micro bubble layer to produce a bonded wafer 14 in which the buried oxide film layer 16 and the SOI layer 15 are formed on the base wafer 11 (see Step S32 in FIG. 1 and FIG. 2 (i)). It is to be noted that in this step, a delaminated wafer 18 having a delaminating plane 19 is derived.

Then, the bonded wafer 14 is subjected to a bonding heat treatment in order to enhance the bond strength at the interface of bonding (see Step S33 in FIG. 1).

As described above, a bonded SOI wafer can be manufactured.

In the method for manufacturing a bonded SOI wafer of the present invention described above, it is preferable to set the first temperature in the first growth of depositing the polycrystalline silicon layer 12 to 900° C. or more. By setting the first temperature to 900° C. or more, it is possible to prevent lowering of productivity, which is caused by getting the deposition rate too low.

It is preferable to set the second temperature in the second growth of depositing the polycrystalline silicon layer 12 to 1100° C. or more. By setting the second temperature to 1100° C. or more, it is possible to obtain sufficiently high deposition rate to improve the productivity, and to sufficiently suppress the warpage of a wafer after depositing the polycrystalline silicon layer. Further, even when the temperature of a heat treatment step of a step for manufacturing an SOI wafer or a heat treatment of a step for manufacturing a device is relatively high (e.g., about 1000 to 1200° C.), since the polycrystalline silicon layer is deposited at the equivalent temperature thereto, it is also possible to sufficiently suppress grain growth of the polycrystalline silicon layer and to sustain an effect as a carrier trap layer thereby.

The upper limit of the second temperature is not particularly limited. This does not have to be set to higher than the maximum temperature in a step for manufacturing an SOI wafer or a step for manufacturing a device (when it is too high, slip dislocations and metal contaminations are apt to generate); and accordingly, it is preferable to set this temperature to that maximum temperature or less, for example, 1200° C. or less.

In the method for manufacturing a bonded SOI wafer of the present invention described above, it is preferable to set the thickness of the polycrystalline silicon layer 12 to 2 μm or more when the base wafer and the bond wafer are bonded.

By setting the thickness of the polycrystalline silicon layer to 2 μm or more when the base wafer and the bond wafer are bonded, the frequency of a bond failure increases due to warpage of a wafer. However, when the second growth has been performed at a higher temperature than in the first growth in depositing the polycrystalline silicon layer, the warpage of a wafer can be suppressed, and accordingly the bond failure can be lowered while enhancing the effect as a carrier trap layer, even when the thickness of the polycrystalline silicon layer is 2 μm or more when the base wafer and the bond wafer are bonded.

It is to be noted that it is preferable to set the thickness of the polycrystalline silicon layer to 10 μm or less when the base wafer and the bond wafer are bonded.

The base wafer 11 can be preferably used for manufacturing a radio frequency device so long as it has a resistivity of 100 Ω·cm or more, which is further preferably 1000 Ω·cm or more, particularly preferably 3000 Ω·cm or more. The upper limit of the resistivity is not particularly limited, but it can be 50000 Ω·cm, for example.

EXAMPLES

Hereinafter, the present invention will be explained in more detail with reference to Examples and Comparative Examples, but the present invention is not restricted thereto.

Example 1

By using a manufacturing method explained in FIGS. 1 to 2, a bonded SOI wafer was produced. Provided that a p-type single crystal silicon with a diameter of 200 mm, crystal orientation of <100>, and a resistivity of 700 Ω·cm was used as a base wafer; and formation of a base oxide film, deposition of a polycrystalline silicon layer (trichlorosilane was used as a source gas), BOX oxidation, hydrogen ion-implantation, a delamination heat treatment, and a bonding heat treatment were performed under the following conditions:

formation of a base oxide film: SC1+SC2 cleaning, the film thickness of an oxide film: about 1 nm deposition of polycrystalline silicon layer: 900° C., atmospheric pressure, the film thickness: 0.3 μm+1130° C., atmospheric pressure, the film thickness: 2.7 μm (the total thickness after polishing: 2.2 μm)

BOX oxidation: 1050° C., the film thickness of an oxide film: 400 nm hydrogen ion-implantation: 105 keV, $7.5 \times 10^{16}/cm^2$ delamination heat treatment: 500° C., 30 minutes, 100% Ar atmosphere bonding heat treatment: 900° C. pyrogenic oxidation+Ar annealing at 1100° C. for 120 minutes.

The warpage of a wafer after polishing the polycrystalline silicon layer was measured, and the state of single-crystallization of the polycrystalline silicon layer after a bonding heat treatment was examined (confirmed by cross-sectional SEM observation). The results are shown in Table 1.

Example 2

A bonded SOI wafer was produced in the same manner as in Example 1. Provided that the polycrystalline silicon layer was deposited under conditions of 950° C., atmospheric pressure, and a film thickness of 0.3 μm+1080° C., atmospheric pressure, and a film thickness of 2.7 μm (the total thickness after polishing: 2.2 μm).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Example 3

A bonded SOI wafer was produced in the same manner as in Example 1. Provided that the polycrystalline silicon layer was deposited under conditions of 1010° C., atmospheric pressure, and a film thickness of 0.3 μm+1130° C., atmospheric pressure, and a film thickness of 2.7 μm (the total thickness after polishing: 2.2 μm).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Example 4

A bonded SOI wafer was produced in the same manner as in Example 1. Provided that the base oxide film was formed under conditions of 800° C., dry $O_2$ oxidation, the oxide film thickness: 30 nm; and the polycrystalline silicon layer was deposited under conditions of 980° C., atmospheric pressure, and a film thickness of 0.3 μm+1100° C., atmospheric pressure, and a film thickness of 2.7 μm (the total thickness after polishing: 2.2 μm).

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Comparative Example 1

A bonded SOI wafer was produced in the same manner as in Example 1. Provided that the polycrystalline silicon layer was deposited under one-stage conditions of 1000° C., atmospheric pressure, and a film thickness of 3 μm (2.2 μm after polishing) without dividing into two stages of a first growth and a second growth.

In the same manner as in Example 1, the warpage of a wafer after polishing the polycrystalline silicon layer was measured, and the state of single-crystallization of the polycrystalline silicon layer after a bonding heat treatment was examined. The results are shown in Table 1.

Comparative Example 2

A bonded SOI wafer was produced in the same manner as in Example 1. Provided that the polycrystalline silicon layer was deposited under one-stage conditions of 1020° C., atmospheric pressure, and a film thickness of 3 μm without dividing into two stages of a first growth and a second growth.

In Comparative Example 2, deposition of single crystal was confirmed by SEM observation after depositing a polycrystalline silicon layer, and a polycrystalline silicon layer failed to deposit thereby. Accordingly, the subsequent steps were not performed.

TABLE 1

|  |  | Example 1 | Example 2 | Example 3 | Example 4 | Comparative Example 1 | Comparative Example 2 |
|---|---|---|---|---|---|---|---|
| Base wafer | | Diameter: 200 mm, Crystal orientation: <100>, Resistivity: 700 Ω · cm, p-type | | | | | |
| Conditions for forming base oxide film | | SC1 + SC2 cleaning, forming oxide film thickness of ca. 1 nm | | | 800° C. dry O2 oxidation forming oxide film thickness of 30 nm | SC1 + SC2 cleaning, forming oxide film thickness of ca. 1 nm | |
| First-growth conditions for depositing polycrystalline-silicon layer | Temp. | 900° C. | 950° C. | 1010° C. | 980° C. | 1000° C. | 1020° C. |
| | Pressure | Atmospheric pressure | | | | | |
| | Thickness | 0.3 μm | | | | 3 μm | |
| Second-growth conditions for depositing polycrystalline-silicon layer | Temp. | 1130° C. | 1080° C. | 1130° C. | 1100° C. | — | Single crystal was confirmed by SEM observation Accordingly post-steps |
| | Pressure | Atmospheric pressure | | | | — | |
| | Thickness | 2.7 μm | | | | — | |
| Thickness of polycrystalline-silicon layer after polishing (total thickness) | | 2.2 μm | | | | | |
| Warpage of wafer after polishing polycrystalline-silicon layer | | 14 μm | 30 μm | 10 μm | 25 μm | 70 μm | |

TABLE 1-continued

|  | Example 1 | Example 2 | Example 3 | Example 4 | Comparative Example 1 | Comparative Example 2 |
|---|---|---|---|---|---|---|
| State of single-crystallization of polycrystalline silicon layer (at completion of SOI wafer) | No problem | | | | | were not performed |

As can be seen from Table 1, in Examples 1 to 4, which were performed with each deposition of a polycrystalline silicon layer divided into the first growth performed at 1010° C. or less and the second growth performed at a temperature higher than in the first growth to deposit the polycrystalline silicon layer thicker than in the first growth, single-crystallization of polycrystalline silicon was prevented while suppressing an increase of the warpage of each wafer. Particularly, in Examples 1 and 3 to 4, in which each second growth was performed at 1100° C. or more, the warpage of each wafer could be more lowered compared to Example 2, in which the second growth was performed below 1100° C.

On the other hand, in Comparative Example 1, in which the polycrystalline silicon layer was deposited at 1000° C. without dividing into the first growth and the second growth, the warpage of the wafer was larger compared to Examples 1 to 4, although single-crystallization of polycrystalline silicon was prevented.

Furthermore, in Comparative Example 2, in which the polycrystalline silicon layer was deposited at 1020° C. without dividing into the first growth and the second growth, the polycrystalline silicon was single-crystallized at the completion of depositing the polycrystalline silicon layer.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded SOI wafer by bonding a bond wafer and a base wafer, each composed of a silicon single crystal, via an insulator film, comprising, in sequential order, the steps of:

depositing a polycrystalline silicon layer on the bonding surface side of the base wafer, polishing a surface of the polycrystalline silicon layer, forming the insulator film on the bonding surface of the bond wafer, forming an ion-implanted layer in the bond wafer, bonding the polished surface of the polycrystalline silicon layer of the base wafer and the bond wafer via the insulator film, and thinning the bonded bond wafer by delaminating along the ion-implanted layer in the bond wafer to form an SOI layer; wherein, as the base wafer, a silicon single crystal wafer having a resistivity of 100 Ω·cm or more is used, the step for depositing the polycrystalline silicon layer further comprises a stage for previously forming an oxide film on the surface of the base wafer on which the polycrystalline silicon layer is deposited, the polycrystalline silicon layer is deposited by a method consisting of two growth stages, a first growth performed at a first temperature of 900° C. or more and 1010° C. or less, and a second growth performed at a second temperature of 1100° C. or more to deposit the polycrystalline silicon layer thicker than in the first growth, deposition of the polycrystalline silicon layer is performed using trichlorosilane as a source gas at atmospheric pressure in the first growth and the second growth, the oxide film is formed by wet cleaning, the oxide film has a thickness of 0.3 nm or more and 10 nm or less, and the polycrystalline silicon layer has a thickness of 2 μm or more when the base wafer and the bond wafer are bonded.

* * * * *